United States Patent [19]

Brock

[11] 3,889,365

[45] June 17, 1975

[54] ELECTRONIC MODULE AND METHOD OF FABRICATING SAME

[76] Inventor: Gordon L. Brock, 7652 Garfield Ave., Space No. 28, Huntington Beach, Calif. 92648

[22] Filed: Aug. 15, 1973

[21] Appl. No.: 388,444

Related U.S. Application Data

[62] Division of Ser. No. 170,200, Aug. 9, 1971, abandoned.

[52] U.S. Cl................... 29/627; 29/626; 174/52 PE; 200/51 R; 264/272; 317/101 R; 317/101 CP; 317/101 F

[51] Int. Cl............................................... H05k 3/32

[58] Field of Search....................... 29/626, 627, 592; 174/52 PE, 59, 50.52, 50.53, 50.54, 50.57; 317/101 R, 101 C, 101 CM, 101 CP, 101 F; 200/51 R; 264/272

[56] References Cited

UNITED STATES PATENTS

| | | | |
|---|---|---|---|
| 2,703,853 | 3/1955 | Chrystie | 317/101 F |
| 2,892,131 | 6/1959 | MacDonnell | 317/101 F |
| 3,031,655 | 4/1962 | Temple et al. | 174/52 PE X |
| 3,164,749 | 1/1965 | Berge et al. | 317/101 CP |
| 3,191,100 | 6/1965 | Soruillo | 317/101 CP |
| 3,575,546 | 4/1971 | Liautaud | 174/52 PE |
| 3,636,285 | 1/1972 | Wickham et al. | 200/51 R |

FOREIGN PATENTS OR APPLICATIONS

| | | | |
|---|---|---|---|
| 744,628 | 2/1956 | United Kingdom | 317/101 F |
| 1,299,683 | 6/1962 | France | 317/101 R |

*Primary Examiner*—C. W. Lanham
*Assistant Examiner*—Joseph A. Walkowski
*Attorney, Agent, or Firm*—Spensley, Horn & Lubitz

[57] ABSTRACT

An electronic module and method of fabrication thereof whereby highly durable and low cost modules are obtained. The leads of the electronic components, such as resistors, transistors, and the like, are cut and bent in a pre-determined manner and the component inserted in openings in an assembly board so that the leads cross at positions where solder connections are to be made. After soldering the components together at the appropriate places and, depending on the circuit, soldering in insulated circuit cross-overs and lead wires, if the component leads are too short for such use, the circuit is removed from the assembly board, rolled into a generally cylindrical shape and the leads thereof inserted into the appropriate pins of a standard electron tube type plug. Thereafter the leads are dipped soldered to the plug pins, an extruded plastic member is snapped over the edge of the plug, and the circuit potted in epoxy within the extruded member to complete the module.

4 Claims, 11 Drawing Figures

GORDON L. BROCK
INVENTOR

BY Spensley, Horn, & Lubitz
ATTORNEYS

INVENTOR
GORDON L. BROCK

BY Spensley, Horn & Lubitz
ATTORNEYS

GORDON L. BROCK
INVENTOR

BY Spensley, Horn & Lubitz
ATTORNEYS

ELECTRONIC MODULE AND METHOD OF FABRICATING SAME

This is a division of application Ser. No 170,200, filed Aug. 9,1971, now abandoned.

BACKGROUND OF THE INVENTION

1. Field of the Invention

This invention relates to the field of electronic circuit packaging.

2. Prior Art

The present invention is directed primarily to the packaging of electronic circuits to achieve high mechanical durabiliby and low cost packaging which may be efficiently practiced even for limited production quantities of the particular package. Therefore, though the package of the present invention may also be used for other purposes, such as a support and connection means for other electrical apparatus, the primary use is in electronic packaging and, therefore, the following discussion of the prior art shall be limited thereto.

Various methods of packaging electronic circuits are well-known in the prior art. The choice of these various methods for any particular application generally depends on the nature of the electronic components to be packaged, that is, whether the package is to include elements such as, by way of example, transformers, chokes, and vacuum tubes, or is to be limited to elements such as resistors, capacitors and semiconductor devices.

In prior art packages, which were to include vacuum tube and gas filled tube devices, it is common practice to use a metal chasis through which the various tube sockets and insulated terminals would be attached so that the tubes can be replaceably inserted into the tube sockets. The other components, such as resistors, capacitors, and the like, are soldered to the terminals and insulated lead wires connected between the various tube socket terminals and the terminals supporting the other components. Transformers, large capacitors, and the like, are, in general, directly bolted to the chasis and inter wired as appropriate. This method of packaging has the advantage of allowing the ready replacement of substantially any component in the circuit, and particularly the vacuum tubes and gas-filled tubes which were especially susceptible to failure. This packaging method, however, further requires some outer case for the physical protection of the components mounted on the chasis and is an expensive packaging method because of the number of sockets, terminals, and the like, which must be individually attached to the chasis and the amount of wiring, generally hand wiring, requiried between the components.

Similar packaging methods are also used with semiconductors devices, in general, however, replacing the metal chasis with a non-conducting board, such as a fiberglass board, or the like, and by the attachment of metal terminals, transistor sockets, ets., to the board. Like the above described method of packaging for vacuum tube circuits, this method of packaging allows the ready replacement of semiconductor devices and other components. However, it too is a relatively expensive packaging method and is not suited for production of any substantial quantities of a circuits.

In recent years most electronic circuits, at least those which do not utilize vacuum and gas-filled tubes, have been packaged using printed circuit boards. In some instances, sockets, such as transistor sockets, are used in conjunction with printed circuit boards in much the same manner as vacuum tubes sockets are used on a chasis. However, because of the long life and high reliability of semiconductor devices, and further, because the cost of most semiconductor devices has been reduced to the point that sockets for such devices is a substantial fraction of the cost of the device itself, and, in some instances, is even higher than the cost of the device, it is common to simply solder the semiconductor device directly to the printed circuit. Thus, the circuit is comprised of various components soldered directly to the circuit pattern on thyprinted circuit board with, in general, some form of lead wire connection and/or plug-in arrangement for inter-connecting circuit boards. Usually, such circuit boards are enclosed within a protective box or housing of some form, though, occasionally, they are simply potted to provide mechanical protection and sufficient rigidity for the circuit.

Printed circuit boards are characterized by a non-conductive board, generally of epoxy impregnated fiberglass, epoxy impregnated paper, phenolic or similar materials, with a patterned layer of copper on one surface thereof inter-connecting a plurality of holes therethrough so as to complete the desired circuit when the various component leads are inserted through the appropriate holes and soldered to the copper pattern. Printed circuit boards are fabricated by starting with a circuit board with a continuous layer of copper on one surface thereof. A layer of photoresist is deposited thereto, is exposed through a suitable mask and is developed so that either the exposed or the unexposed portions of the photoresist, depending upon the nature of the photoresist, are dissolved away. Thereafter the circuit board is placed in an etchant and the exposed portions of a layer of copper are etched away, leaving only the copper located under the photoresist. The remaining photoresist is then dissolved away, leaving the desired copper pattern on the surface of the board. Thereafter, or as an alternative, at an earlier stage of the fabrication, the appropriate holes for receiving the leads of the various components are drilled in the board. finally, in the assembly of the circuit, the leads of the various components are appropriately bent and inserted through the appropriate holes for soldering, usually dip-soldering, to the circuit board and the component leads are cut so as to finish the circuit board assembly.

Printed circuit board techniques have been theretofore generally used for items to be produced in great volume, and much automatic or semi-automatic equipment has been designed to aid in the fabrication and assembly of printed circuits. Tape controlled printed circuit board drilling machines, component lead bendors, automatic component insertion equipment, dip-soldering equipment, and the like, are widely used for high volume production. However, there are a number of disadvantages of printed cirucit packages which detract from their usefulness in certain application because of their cost and lack of mechanical integrity.

The basic copper clad board from which the printed circuit board is fabricated is a relatively expensive board and must undergo a number of processing steps before the printed circuit pattern is achieved. Photoresist coating, exposing, developing and etching are all time consuming and relatively expensive procedures which must be carried out with fairly high precision if a quality circuit board is to result. The holes for receiving the component leads must be drilled by an automatic, or at least semiautomatic, drilling machine, and the components must be automatically inserted into the holes if the assembly is to be achieved in any reasonable time. The plurality of time consuming operations and the expense of the automatic equipment required to produce a circuit board result in a relatively high cost for such boards, even in high volume production. Further, the required mask and the specialized control of the drilling machine and of the component inserting the equipment result in a substantial fixed cost independent of the number of circuit boards to be fabricated, thereby resulting in an extremely high cost for each circuit board if only a few circuits boards of a given design are to be fabricated. Further, the circuit board itself has no convenient means for interconnection with other circuit boards or other devices and connectors for circuit boards are characteristically very expensive and do not in themselves provide sufficient support or any protection for the board to protect the board or components thereon from damage as a result of shock, vibration, and the like.

Consequently, there is needed a simple electronic circuit packaging method which makes use of inexpensive components, which is easily practiced without expensive equipment and time consuming processes, and which requires a minimum of specialized tooling and set-up so as to be economical for use on low quantity production, and, finally, which results in a package of high durability and resistance to shock, vibration, and other environmental affects.

BRIEF SUMMARY OF THE INVENTION

An electronic module and method of fabrication thereof whereby highly durable and low coast modules are obtained. The first step in fabrication of the modules is to lay out the desired circuit in a manner so as to minimize the number of circuit cross-overs and to dispose the various components in a manner so as to provide leads extending in a given direction from the circuit. A special fixture is then fabricated from a material such as, by way of example, epoxy impregnated fiberglass board by cutting holes and openings of other shapes to correspond to the general outline of the various components. The leads of the electronic components such as resistors, transistors and the like, are then cut and bent in a predetermined manner and the components inserted into the openings in the board so that the component leads cross in a position where solder connections are to be made. Circuit crossovers may be separately insulated, if necessary, and additional leads may be soldered in place to provide leads or other connections for various components if the leads and the components themselves are not sufficiently long. After soldering the components together at the appropriate places, the circuit may then be removed from the assembly board as one unit, rolled into a generally cylindrical shape, and the leads thereof inserted into appropriate pins of a standard electron tube type plug. Thereafter the leads are dip soldered to the plug pins, an extruded plastic member is snapped over the edge of the plug and the circuit potted in epoxy within the extruded member to complete the module. Various alternate embodiments of the present invention are disclosed whereby the techniques of the present invention may be used to construct cascaded modules, adjustable modules and assemblies having combined electrical, mechanical and other functions.

DETAILED DESCRIPTION OF THE INVENTION

The present invention is best described with reference to the method of fabrication thereof and, by way of specific example, the method and the apparatus for fabrication of a specific electronic module. It is to be understood, however, that the specific embodiment described hereafter in detail, is for purposes of explanation only and most other circuits and electrical apparatus may be packaged using the principles of the present invention, as further described herein.

Figure 1:
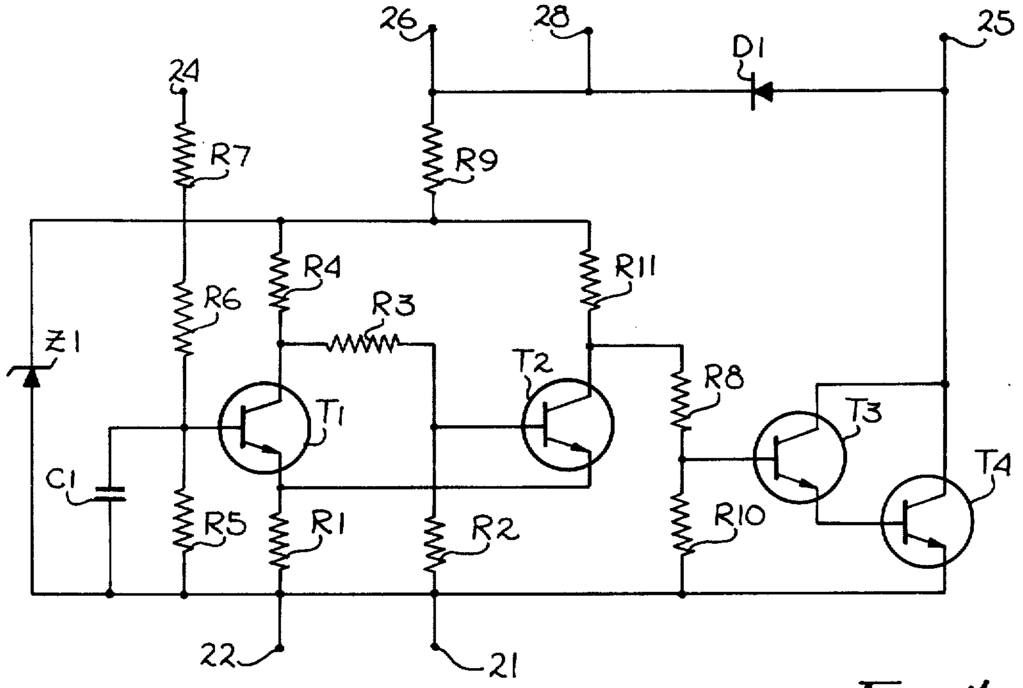
FIG. 1 is a circuit diagram of a typical circuit that may be packaged by the methods of the present invention.

First referring to FIG. 1, a typical circuit that might be packaged with the method of the present invention may be seen. This circuit is for a DC relay controller. Terminal 21 is the ground terminal and terminal 26 is the positive terminal for connection to the relay coil and terminal 24 is the input signal terminal. Resistor R9 in combination with zener diode Z1 provides voltage regulation for the biasing of transistors T1 and T2. Resistors R5, R6, and R7 form a voltage divider for control of base of transistor T1, with capacitor C1 providing a noise filter for the base of transistor T1. Resistors R1 and R4 limit the current and establish the operating voltages for transistor T1, and resistors R3 and R2 provide a voltage divider coupling the output of transistor T1 to the base of transistor T2. Resistor R11 in combination with Resistor R1 establishes the voltage levels and limits the current in transistor T2, the output signal of which is coupled through a voltage divider comprising resistors R8 and R10 to the base of transistor T3. Transistors T3 and T4 are connected in the well-known darlington configuration so as to provide very high current gain for the circuit. When the signal applied at terminal 24 is a high signal, that is, an appreciable positive voltage, transistor T1 is turned on. lowering the voltage on the base of transistor T2 and turning that transistor off. thus, the voltage on the base of transistor T3 is increased, turning on transistor T3 which in turn turns on transistor T4. Thus, with a positive signal applied at terminal 24, transistor T4 is turned on, thereby effectively connecting terminal 25 to terminal 21, resulting in the energization of the relay coil connected between terminals 28 and 25. When the voltage applied at terminal 24 is low (near zero or is negative) transistor T1 is turned off. This turns on transistors T2 which in turn turns off transistors T3 and T4, thereby de-energizing the relay coil.

Figure 2:
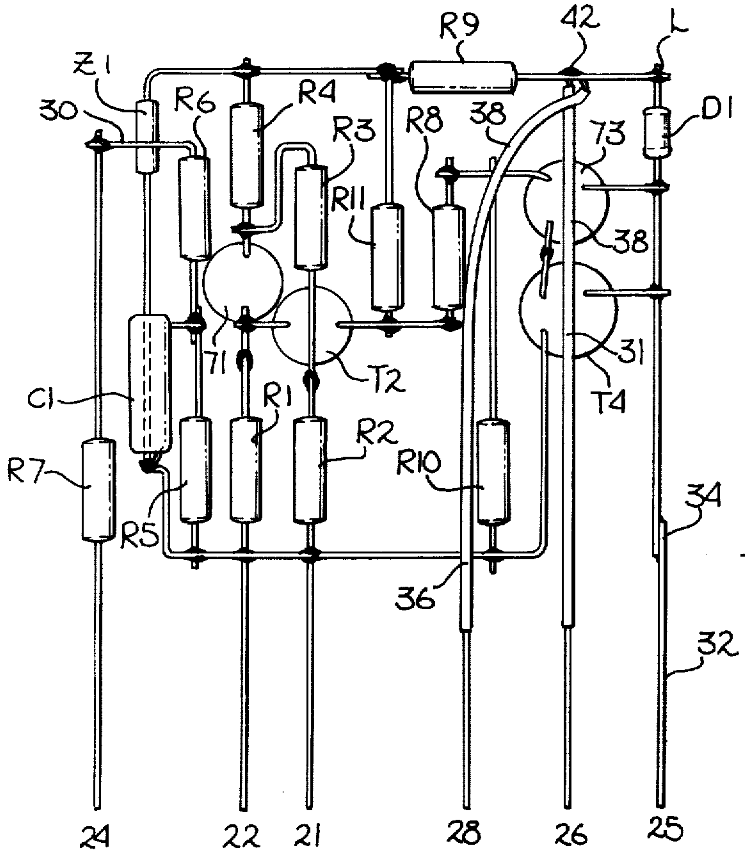
FIG. 2 is a component layout for the circuit of FIG. 1 so as to minimize circuit crossovers and to position the leads in the desired manner for packaging according to the teaching of the present invention.

To fabricate this circuit with the method of the present invention, the circuit is first reorganized on paper, in a manner somewhat similar to that used for the layout of printed circuits, so as to minimize the number of circuit cross-overs required in the circuit, and further to result in the desired orientation and location of the leads. Thus, for the circuit of FIG. 1, the circuit may be laid out as shown in FIG. 2. In this figure, the circuit components are drawn approximately to scale in the relative positions that they will occupy in the final package. The enlarged junctions between the leads of the various components schematically represent solder joint mechanically and electrically inter-connecting the components. In the component orientation of FIG. 2, there is only one circuit cross-over, that being to the circuit cross-over generally indicated by the numeral 30 connecting resistor R6 and R7. This circuit cross-over may be accomplished by positioning Z1 and R6 and by appropriately bending the lead of R6 so that the lead is disposed over the insulated case of the zener diode Z1. Thus, though the lead of resister R6 is not an insulated lead, insulation is effectively achieved by disposing the lead over the insulated case of the zener diode.

It may be seen that the lead 21, 22 and 24 are formed merely by the component leads of resistors R2, R1 and R7, respectively, In the case of diode D1, the diode lead is not sufficently long to form terminal 25 and, therefore, a separate lead wire 32 is soldered to the end of the diode lead, generally in the area indicated by the numeral 34. The leads 26 and 28 are formed by wires crossing over the circuit at two points, generally indicated by the numerals 36 and 38 and are soldered to the leads of resistor R9 at point 40. These leads, being formed by separate wires and not be leads of any of the components, are insulated leads so that insulation of the cross-overs in the areas 36 and 38 is automatically achieved.

Figure 3:
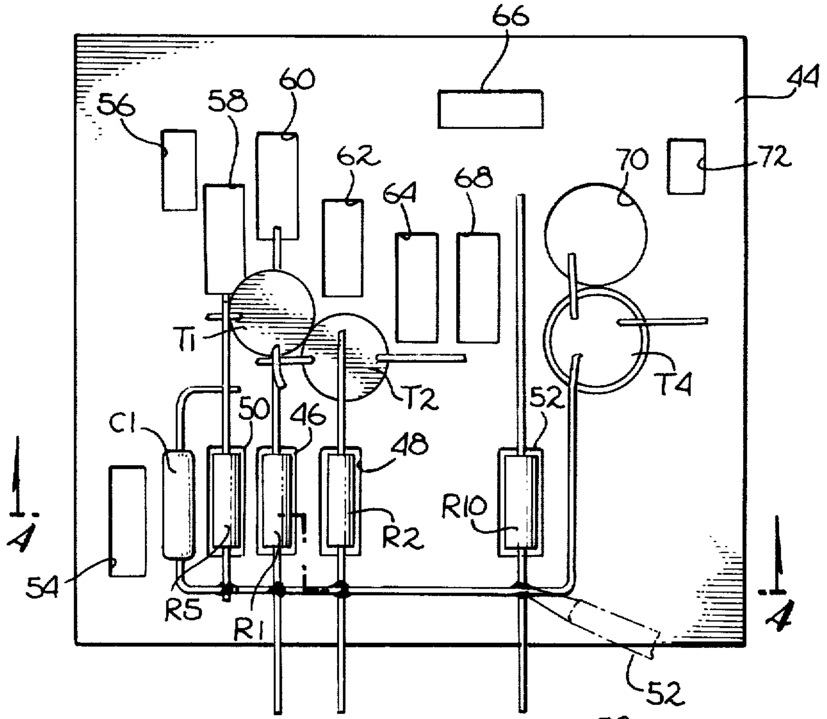
FIG. 3 is a top view of the assembly board for assemblying the circuit of FIGS. 1 and 2.
Figures 4, 5, 6:
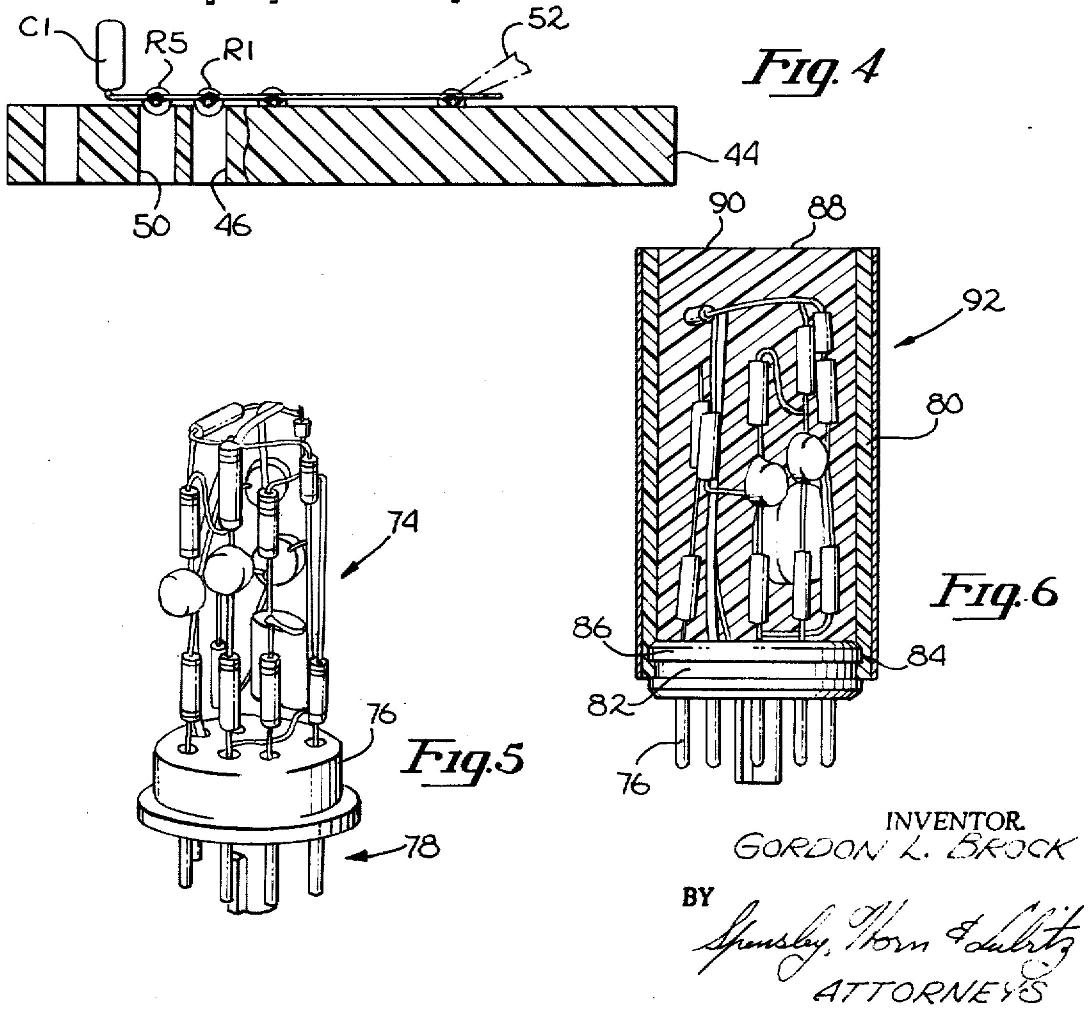
FIG. 4 is of the cross-section of the assembly board of FIG. 3, taken along lines 4—4 of that figure.
FIG. 5 is a perspective view of the circuit of FIG. 2, after the components have been soldered together with the use of the assembly fixture of FIG. 3, and rolled intc a generally cylindrical shape, and soldered into a plug.
FIG. 6 is a partial cross-section of a finished module of the present invention.

Now referring to FIGS. 3 and 4, an assembly fixture for assemblying the circuit of FIG. 2 may be seen. FIG. 3 is a top view of the assembly fixture with some of the components of the circuit disposed thereon, and FIG. 4 is a cross-section taken along lines 4—4 of FIG 3. The assembly fixture is comprised of a special board 44, having a plurality of openings or pockets therein of suitable size, physically located in the positions of the components in the circuit. Each hole or opening is slightly larger than the associated component so that the component may be placed over the appropriate opening so as to be aligned thereby, and allosed to rest with its leads supported by the board. by way of example, in the view of FIG. 3, components R1, R1, R5 and R10 are shown in position over their respective board openings 46, 48, 50 and 52, and being supported by the extension of their leads beyond the edge of the openings. Also shown in position with the leads properly cut and bent are transistors T1, T2 and T4. In this particular circuit, transistors T1 and T2 have an epoxy case and merely fit within appropriate holes in the board. Transistor T4 has a T05 can with a flange at the base thereof so that this transistor will rest on the flange rather than on it leads. Capacitor C1, on the other hand, is disposed so as to project upward above the board and consequently there is not an equivalent pocket in the board for receiving the capacitor. Instead, the capacitor leads are cut and bent in the desired manner and the capacitor is held with tweezers until soldered in place with the other components with a soldering iron, such as generally indicated by the numeral 52. The additional pockets 54, 56, 58, 60, 62, 64, 68, 70 and 72 are for receiving components R7, C1, R6, R3, R11, R9, R8, T3 and D1, respectively.

The board 44 may be fabricated from any readily machinable material. However, metals, though having an advantageous heat sinking property which will minimize the temperature rise in the various components during soldering, tend to make soldering a little more difficult and to require more heat to make a solder connection because the tendency of the fixture to conduct head away from the solder joint. Other materials such as epoxy impregnated fiberglass board have been found more suitable for such use, being easily machined and allowing the easy soldering of the various joints without significant degradation of the board. Of course, excessive heat should not be used in making the solder joints, not only because of the possibility of damaging the fixture, dependent upon the material used therefor, but also to avoid over-heating the various components in the circuit.

Once all the components have been placed in the fixture and soldered, the circuit may be physically moved from the fixture, and when removed will appear as shown in FIG. 2. The circuit may then be coiled by hand, generally around a finger, so as to take a cylindrical shape with capacitor C1 directed toward the inside of the cylinder and with lead 24 disposed adjacent to lead 25 (FIG. 2). In this regard, it should be noted that the circuit has purposely been laid out so that when coiled, the leads 21, 22, 24, 25, 26 and 28 will be disposed in proper physical position to match terminals 1, 2, 4, 5, 6 and 8, respectively, on a plug for a standard vacuum tube socket.

When the circuit is properly coiled, it may be inserted into the plug, such as a standard molded phenolic plug for an octol socket as shown in FIG. 5. In that figure, the coiled circuit, generally indicated by the numeral 74, is inserted into the octol plug 76 and is soldered thereto by dipping the lower end of the plug, generally indicated by the numeral 78, into a solder pot. Plugs, such as octol plug 76, are standard plugs in the electronics industry and may be purchased complete at the present time for less than 15 cents a piece in quantity. For the mating connector, octol sockets are somewhat cheaper. Furthermore, since the same plugs and sockets will be used for many different circuits, the plugs and sockets may be purchased in quantity, even though no one circuit is to be manufactured in any substantial quantity. Thus, the plug and mating socket may be purchased for less than 30 cents, and made to serve as both mechanical and electrical connection of the circuit, as shall subsequently be described. This is to be compared with a cost for printed circuit board connectors of a few dollars or more, which connectors provide no substantial mechanical support for the circuit.

Once the circuit 74 has been soldered into the plug 76, as shown in FIG. 5, an outer tubular plastic member 80 is snapped over groove 82 on the plug (groove 82 is standard on this type of socket and thus no machining is required for this purpose). Plastic member 80 may be a simple tubular member, preferably of a slightly flexible material, having an undercut region 84 adjacent one end thereof to receive the lip 86 above groove 82 on the socket. In the preferred embodiment, plastic member 80 is an extruded member having a plurality of fins thereon, as may be seen in FIGS. 7 through 9. The material of the plastic member 80 is polyvinyl chloride and the various plastic members are cut to the desired length from a longer length of extruded material, and the undercut region 84 is then provided by a simple machining operation.

After the plastic member 80 is stamped over the end of plug 78, the plastic member is filled with a potting compound 88 which may be an epoxy compound or other suitable potting material, such as polyesters and the like. When the potting material 88 has hardened, the top surface 90 may be machined to provide a flat, more finished looking top surface, or may be left in the as potted condition, providing a glossy though not entirely flat top surface. Though the finned character of the plastic member 80 would appear to have usefulness in providing an increased cooling surface for the module, little cooling is actually provided unless special precautions are taken. By way of example, polyvinyl chloride and most potting materials are not good conductors of heat. Therefore, in the event components are to be used in the circuit which will have a substantial heat dissipation, potting compounds selected for their thermal conductivity should be used and, if necessary, the polyvinyl chloride plastic member 80 replaced with a better thermal conductor such as a metal tube or even a finned tube such as a finned aluminum extruded tube.

Figure 7:
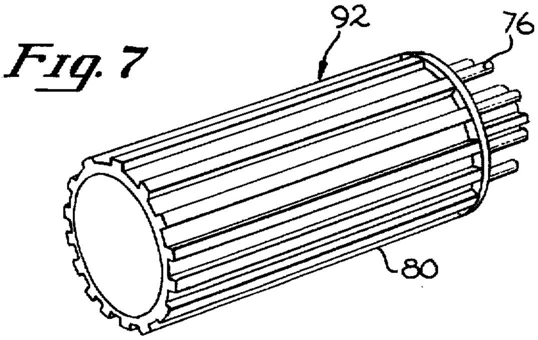
FIG. 7 is a perspective view of the finished module ol FIG. 6.
Figure 8:
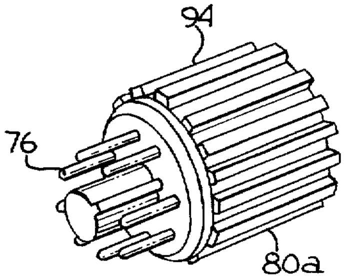
FIG. 8 is a perspective view of an alternate module illustrating the manner in which the size of the modules may readily be varied, depending upon the circuit packaged therein.
Figure 9:
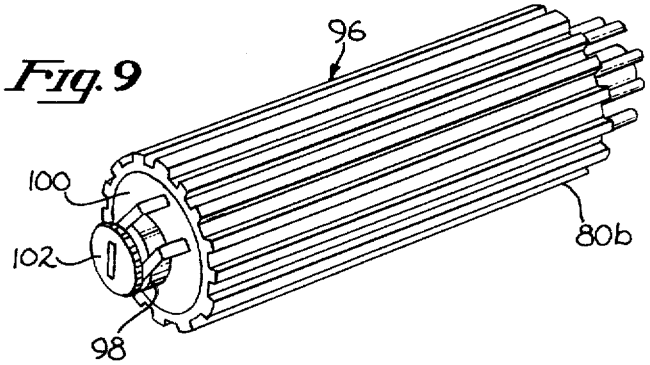
FIG. 9 is a perspective view of an alternate module illustrating the manner in which adjustable components may be used in the modules of the present invention.

Now referring to FIGS. 7 through 9, various forms of completed modules are shown. In FIG. 7 the module 92 of FIG 6 is shown in perspective. It may be seen that the module of the present invention is a fully incapsulated and protected module, readily mechanically and electrically connected in circuit by merely plugging the plug 76 into a mating socket wired into the circuit In FIG. 8, a shorter package 94 is shown for packaging smaller circuits than one hereinbefore described. it may be seen that the same plug 76 and a similar outer plastic member is used for the package of FIG. 8 as it is used for the package of FIG. 7, though the outer plastic member 88 is cut into shorter lengths for the shorter package. Thus, it may be seen that using one basic extruding and standard plugs and sockets, modules for packaging circuits of various sizes and complexity may be made.

Now referring to FIG. 9, a still further variation of the module of the present invention may be seen. In this figure potentiometer 98, of the type generally sold for use on printed circuit boards, is wired into the circuit packaged within the module 96 and the outer plastic member 80*b* is cut to a length so that when filled to the top surface 100, the potentiometer mounting lugs will be partially potted, and the potentiometer adjusting member 102 will be accessible for adjustment of the potentiometer. As a further variation, plastic member 80*b* might be cut to a length so as to project over the potentiometer 98, with the potting terminating at the same position as shown in FIG. 9 so that the potentiometer is covered and protected by an extension of the plastic member 80*b*. Of course, other components which are desired to be left accessible such as variable inductors, variable capacitors or even components which may by subject to replacement may be packaged in a similar manner.

Figure 10:
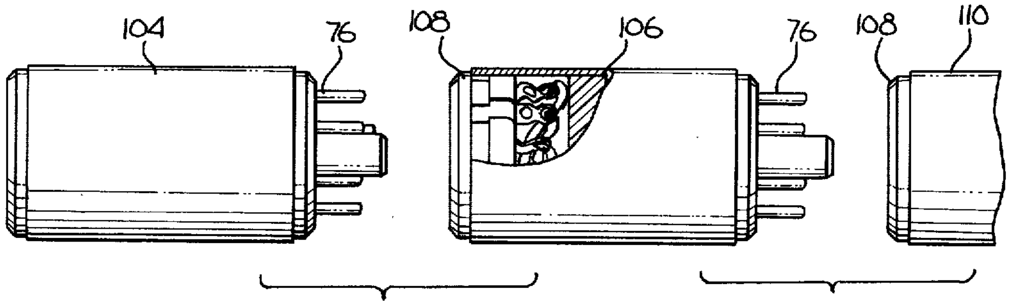
FIG. 10 is a side view of a plurality of modules indicating the manner in which modules of the present invention may be saccaded.

Now referring to FIG. 10, a further alternate embodiment of the present invention may be seen. This figure shows a first module 104, generally similar in construction to that hereinbefore described, second module 106 having a plug 76 on one end thereof and a female socket 108 on the other end therof, and a third connection 110, also having a female socket 108 thereon. The third connection 110 may be attached to an electric cable, a chassis or may be part of still another module. As may be seen in the figure, the first module 104 may be plugged into the second module 106 and that module, in turn, plugged into the connection 110. thus, the module 106 provides an intermediate module which, in conjunction with module 104, provides the desired function without requiring more than one socket on the chassis or connection 110. this configuration may be useful in situations where some standard electronic function is to be coupled with some special electronic function. By way of example, module 106 might be a standard power supply module while module 104 might be a multiplier or other special circuit. In such case, one or more of the plug connections on module 106 might be wired directly to corresponding terminals in socket 108 on the module 106. Also, since the modules of the present invention are generally not repairable but are designed to be throw-away modules, the configuration of FIG. 10 may be advantageous in certain applications to subdivide a particular circuit into two cascaded modules so as to make this circuit replaceable in two parts rather than only one.

Figure 11:
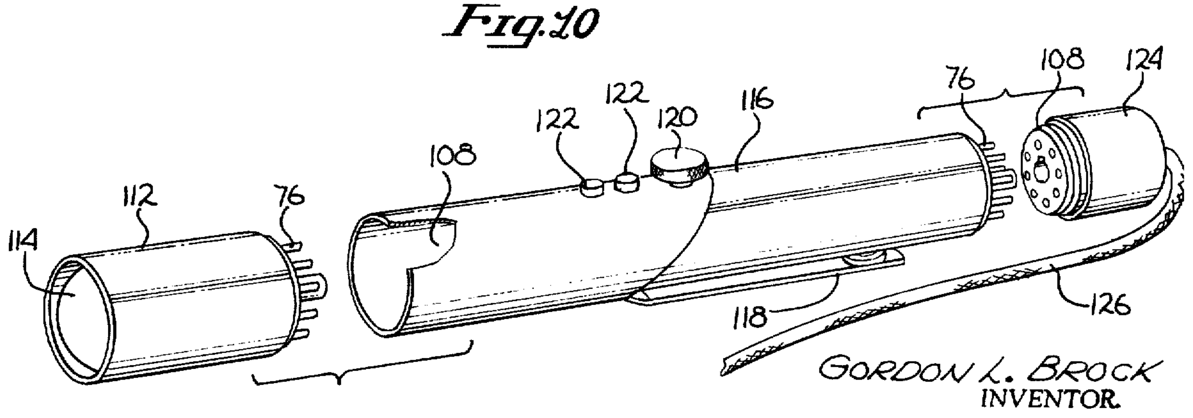
FIG. 11 is a perspective view of the timing light for use in conjunction with electronic automobile engine analyzer showing first module containing a flash tube and lens, a second module having a plurality of controls and indicating light thereon, and a third module attached to a cable or electrical connection to the engine analyzer.

Now referring to FIG. 11, a further use for the present invention may be seen. In the previous embodiments, the function of the various modules was electronic in nature, whereas the modules of FIG. 11 form the end unit of an automobile engine timing light. The first module 112 contains a flash tube, not shown, located behind a lense 114 which is connected to a male plut 76. A second module 116 forms the basic hand control unit and has a socket 108 for mating with plug 76. Module 116 is provided with an on-off switch 118, a timing-like flash advance-retard control 120, and a pair of lights 122 for indicating an advance or retard condition. the second module 116 also has a plug 76 for plugging into socket 108 attached to a termination module 124 which provides the basic connection to cable 126, the other end of which is adapted to plug into an electronic engine analyzer (not shown). Thus it may be seen that in this application, electrical and mechanical connection is made to a module having various mechanical controls and indicating lights thereon which in turn mates with another module for providing an output in the form of controlled light flashes, thereby readily allowing the interchange of modules upon failure or damage of one of them. Thus it will be understood by those skilled in the art, that the modules of the present invention may be used to package various electronic devices electro-optical devices, electromechanical devices and the like, to provide a very inexpensive package of high ruggedness and reliability, suitable for production in any quantities and particularly suitable for production in small quantities where prior art packaging techniques such as printed circuit techniques are unnecessarily expensive. Thus, while invention has been particularly shown and described with reference to preferred embodimetns thereof, it will be understood by those skilled into the art that various changes in form and details may be made therein without departing from the spirit and scope of the invention.

I claim:

1. a method of packaging an electronic circuit having a plurality of electronic components comprising:

a. fabricating a reuseable board with a plurality of means for receiving and restraining said components in a predetermined relative disposition;

b. cutting and bending the leads of said components and disposing said components in their respective positions on said board so that said leads are disposed adjacent each other at points where circuit connections are to be made, and are disposed to form circuit leads projecting in a first direction from said circuit;

c. joining said leads where said leads are adjacent each other to form said circuit connections and to provide a self supporting circuit structure;

d. removing said circuit and circuit leads from said board and coiling said circuit about an axis parallel to said first direction;

e. connecting said circuit leads to a connector;

f. providing an open-ended cover over said circuit mating with said connector; and g. potting said circuit by pouring a potting compound into said open-ended cover.

2. The method of claim 1 further including the additional step of soldering additional wires into said circuit to extend said leads of said components where said leads of said components are too short to reach said circuit connections or to form said circuit leads.

3. The method of claim 1 wherein said electronic components further include at least one component which is mechanically adjustable, said adjustable component being connected to said circuit so as to be adjustable from a second direction opposite said first direction, and said potting compound is poured into said open ended cover to a depth to retain said adjustable component without interfering with the adjustability thereof.

4. A method of packaging an electronic cirucit having a plurality of electronic components comprising the steps of :

a. fabricating a board with a plurality of means for receiving and restraining said components in a predetermined relative disposition;

b. cutting and bending the leads of said components and disposing said components in their respective positions on said board so that siad leads are disposed adjacent each other at points where circuit connections are to be made and are disposed to form circuit leads projecting ain a first direction from said circuit;

c. soldering said leads where said leads are adjacent each other to form said circuit connections and to provide a self supporting circuit structure;

d. removing said circuit and circuit leads from said board and coiling said circuit about an axis parallel to said first direction and through an angle approaching 360' so that the opposite sides of said circuit structure are approximately adjacent each other;

e. connecting said circuit leads to a connector plug of the type having a generally circular molded base with a plurality of hollow connector pins disposed in a circle and a retaining ring groove molded therein, by inserting said circuit leads into selected ones of said hollow pins and soldering them thereunto;

f. slipping a tubular cover overe said circuit and causing said cover to snap into groove in said plug; and g. potting said circuit by pouring a potting compound into the open end of a said cover.

* * * * *